United States Patent
Takahashi

(10) Patent No.: US 6,566,216 B1
(45) Date of Patent: May 20, 2003

(54) METHOD OF MANUFACTURING A TRENCH TRANSISTOR

(75) Inventor: Toshifumi Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/465,745

(22) Filed: Dec. 17, 1999

(30) Foreign Application Priority Data

Dec. 18, 1998 (JP) ............................. 10-360357

(51) Int. Cl.[7] ............................. H01L 21/336
(52) U.S. Cl. ............. 438/306; 438/307; 438/291; 257/330
(58) Field of Search ............... 438/282, 291, 438/297, 300–307, 526, 296; 257/330, 332, 336

(56) References Cited

U.S. PATENT DOCUMENTS

| | | | | |
|---|---|---|---|---|
| 5,374,575 A | * | 12/1994 | Kim et al. ................. | 438/291 |
| 5,538,913 A | * | 7/1996 | Hong et al. ................ | 438/282 |
| 5,545,579 A | * | 8/1996 | Liang et al. ............... | 438/291 |
| 6,201,278 B1 | * | 3/2001 | Gardner et al. ............ | 257/330 |

FOREIGN PATENT DOCUMENTS

| | | |
|---|---|---|
| JP | 60-42866 | 3/1985 |
| JP | 63-865569 | 4/1988 |
| JP | 63-211762 | 9/1988 |
| JP | 4-259258 | 9/1992 |
| JP | 5-29340 | 2/1993 |
| JP | 7-211908 | 8/1995 |
| JP | 9-116142 | 5/1997 |

* cited by examiner

*Primary Examiner*—David Nelms
*Assistant Examiner*—Dung A Le
(74) *Attorney, Agent, or Firm*—McGinn & Gibb, PLLC

(57) ABSTRACT

To provide a semiconductor device and a process for manufacturing the same which is capable of suppressing short channel effect and preventing a current from leaking between a contact and a silicon substrate. The semiconductor device of the present invention comprises a silicon substrate on which a source/drain area (3 in FIG. 1), a silicon oxide layer (4 in FIG. 1) and a silicon nitride layer (5 in FIG. 1) are successively formed in this order, and a trench which extend through said layers to split the source/drain area. A columnar gate electrode (9 in FIG. 1) is formed within the trench in such a manner that it is spaced from the inner wall of the trench and a lightly doped drain (LDD) area (10 in FIG. 1) is formed at an area of the bottom of the trench in which no gate electrode is disposed. In such a structure, the short channel effect which occurs in association with reduction in the gate length is suppressed.

9 Claims, 3 Drawing Sheets

F I G. 3 (A)    PRIOR ART
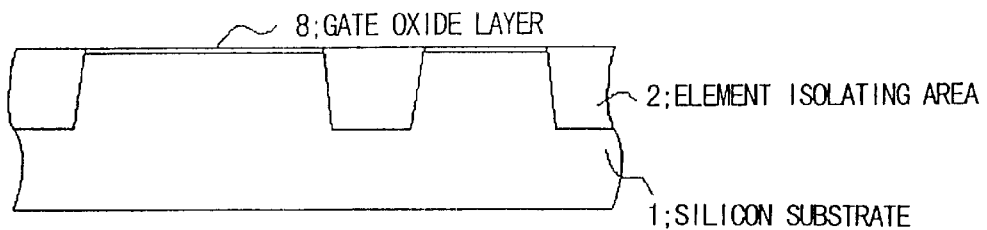
F I G. 3 (B)    PRIOR ART
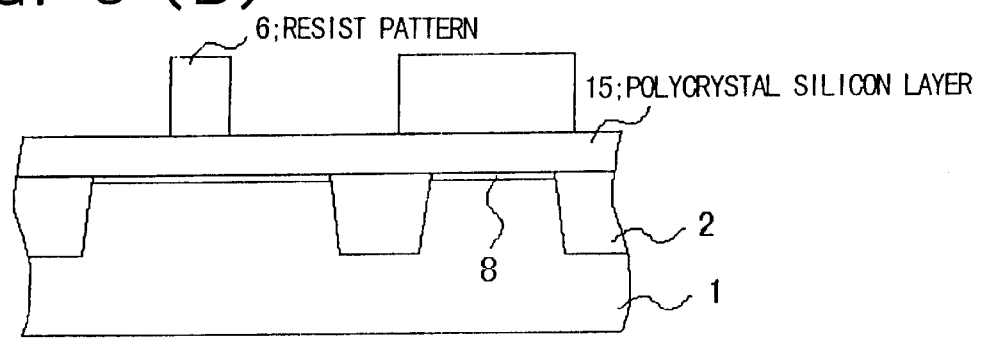
F I G. 3 (C)    PRIOR ART
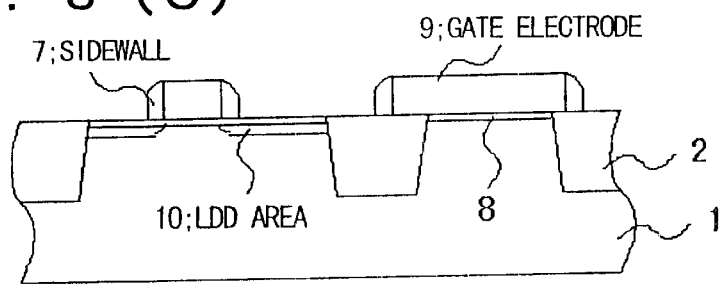
F I G. 3 (D)    PRIOR ART
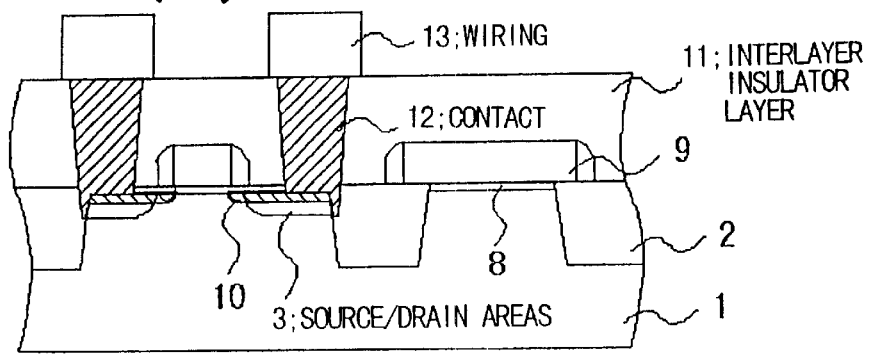

US 6,566,216 B1
METHOD OF MANUFACTURING A TRENCH TRANSISTOR

FIELD OF THE INVENTION

The present invention relates to a semiconductor device and a process for manufacturing the same.

BACKGROUND OF THE INVENTION

In recent years, the dimension of each component of semiconductor elements, in particular the dimension of the gate length tends to decrease as the semiconductor devices tend to be smaller and faster in its speed. A process for manufacturing such a prior art semiconductor device will be described with reference to FIG. 3. FIGS. 3(A) through 3(D) are sectional views schematically explaining a process for manufacturing the prior art semiconductor device.

Firstly, as shown in FIG. 3(A), a silicon substrate 1 is formed thereon with element isolating areas 2 by using, for example, a trench isolating and forming process and is then formed with a gate oxide layer 8. Then, a polycrystal silicon layer 15 and the like designed to become a gate electrode 9 is formed thereon as shown in FIG. 3(B), Subsequently, a resist pattern 6 for forming a gate electrode 9 is formed. The polysilicon layer 15 is then etched using the resist pattern 6 as a mask as shown in FIG. 3(C). Thereafter, a lightly doped drain (LDD) area 10 is formed by implanting ions of arsenic or phosphorus, and boron or boron fluoride into N and P channel areas, respectively, at a dose rate of 5E12 $cm^{-2}$ to 2-5E14 $cm^{-2}$ by an ion implanting process. The LDD configuration is effective for forming a short channel transistor.

Subsequently, a sidewall 7 having a thickness of 30 nm to 100 nm is formed of, for example, a silicon oxide layer externally of the gate electrode 9. Thereafter, source/drain areas 3 designed to become defused layer areas are formed by implanting ions of arsenic or phosphorus, or boron or boron fluoride into N or P channel areas, respectively, at a dose rate of 1E15 $cm^{-2}$ to 2-1E16 $cm^{-2}$ by the ion implanting process.

Then, an interlayer insulator layer 11 is formed as shown in FIG. 3(D) and is then a resist pattern for forming a contact 12 is formed. Thereafter, the interlayer insulator layer 11 is etched using the resist pattern as a mask. This etching is conducted under such a condition that a selection ratio between the silicon oxide layer 5 and the interlayer insulator layer 11 can be adjusted. Thereafter, the inside of the contacts is filled with, for example, tungsten and then wiring 13 is formed. A semiconductor device is thus manufactured.

SUMMARY OF THE DISCLOSURE

However, the gate length can not be made shorter than the limitation of the lithography in the above-mentioned prior art process for manufacturing the semiconductor device. Also the source/drain areas 3 should be formed deeper than the gate electrode 9. Accordingly, there is a problem in that a short channel effect in which the breakdown voltage between the source and drain areas 3 is lowered so that occurrence of a punch through is liable to occur cannot be suppressed.

Furthermore, the element isolation areas 2 would be etched upon etching of the contact (hole) 12 if the contact (hole) 12 is formed opening above the element isolation area 2. Accordingly, the element isolation area 2 would be dug. A problem will occur in that a leakage between the contact 12 and the silicon substrate 1 takes place.

Generally, the present invention aims at overcoming the above-mentioned problems. It is therefore a main object of the present invention to provide a semiconductor device and a process for manufacturing same, which is capable of suppressing the short channel effect and preventing the leakage of current between the contact and the silicon substrate. Other objects will become apparent in the entire disclosure.

According to a first aspect of the present invention, there is provided a semiconductor device comprising: a trench which splits a source/drain layer formed on a semiconductor substrate and has such a depth that it reaches the semiconductor substrate; and a columnar gate electrode which is disposed within the trench at a position which is spaced from a sidewall of the trench.

According to a second aspect, there is provided a semiconductor device comprising: a trench which splits a source/drain layer formed on a semiconductor substrate having a lightly doped drain (LDD) layer and the source/drain layer successively formed thereon in this order and has such a depth that it reaches the lightly doped drain layer; a doped area beneath the trench, which splits the lightly doped drain layer and reaches the semiconductor substrate; and a columnar gate electrode which is disposed within the trench at a position spaced from a sidewall of the trench.

A third aspect of the present invention resides in a semiconductor device characterized in that a semiconductor substrate is successively formed with a source/drain layer, a silicon oxide layer and a silicon nitride layer in this order at an area lying between element isolating areas; and in that the device comprises a trench having such a depth that it extends through the source/drain layer, the silicon oxide layer and the silicon nitride layer to reach the semiconductor substrate; a columnar gate electrode which is formed with the trench at a position spaced from a sidewall of the trench and abuts to the semiconductor substrate through a gate oxide layer; and a lightly doped drain layer which is formed at an area which is not covered with the gate electrode, within an area where the semiconductor substrate is in contact with the trench.

A fourth aspect of the present invention resides in a semiconductor device characterized in that a lightly doped drain layer, a source/drain layer, a silicon oxide layer and a silicon nitride layer are successively formed in order on a semiconductor substrate at an area between element isolating areas; and in that the device comprises a trench having such a depth that it extends through the source/drain layer, the silicon oxide layer and the silicon nitride layer to reach the semiconductor substrate; a columnar gate electrode which is formed with the trench at a position spaced from a sidewall of the trench and abuts to the semiconductor substrate through a gate oxide layer; and a lightly doped drain layer which is formed at an area bebeath the gate electrode, within an area where the semiconductor substrate is in contact with the trench.

A fifth aspect of the present invention resides in a process for manufacturing a semiconductor device characterized in that the process comprises the steps of: (a) forming element isolating areas on a semiconductor substrate; (b) forming a source/drain layer of a transistor by an ion implanting process; (c) successively laminating a silicon oxide layer and a silicon nitride layer in this order; (d) forming a trench having such a depth that it reaches the semiconductor substrate by etching the silicon nitride layer, the silicon oxide layer and the source/drain layer by using a resist pattern as a mask; (e) forming a sidewall on an inner wall of the trench; (f) filling a space surrounded by the sidewall of the trench with a first electrically conductive material designed to become a gate electrode; (g) removing the sidewall; (h) forming a lightly doped drain layer by implanting ions via an area in which the sidewall has been removed; (i) forming an interlayer insulator layer over an entire of the semiconductor substrate; (j) forming a contact hole by etching through the interlayer insulator layer, the silicon nitride layer and the silicon oxide layer; and (k) forming a predetermined wiring after embedding the inside of the contact hole with a second electrically conductive material.

A sixth aspect of the present invention resides in a process for manufacturing a semiconductor device characterized in that the process comprises steps of: (a) forming element isolating areas on a semiconductor substrate; (b) forming a source/drain layer of a transistor by an ion implanting process; (c) successively laminating a silicon oxide layer and a silicon nitride layer in this order; (d) forming a trench having such a depth that it reaches the semiconductor substrate by etching the silicon nitride layer, the silicon oxide layer and the source/drain layer by using a resist pattern as a mask; (e) forming a sidewall on an inner wall of the trench; (f) forming a doped area which splits the lightly doped drain layer below the trench by implanting a dopant by using the sidewall as a mask; (g) removing the sidewall; (h) forming a lightly doped drain layer by implanting ions via an area in which the sidewall has been removed; (i) forming an inter layer insulator layer over an entire of the semiconductor substrate; (j) forming a contact hole by etching through the interlayer insulator layer, the silicon nitride layer and the silicon oxide layer; and (k) forming a predetermined wiring after embedding the inside of the contact hole with a second electrically conductive material.

BRIEF DESCRIPTION OF THE DRAWINGS

FIGS. 3A–3D are sectional views explaining a process for manufacturing a prior art semiconductor device.

PREFERRED EMBODIMENTS OF THE INVENTION

Figure 1:
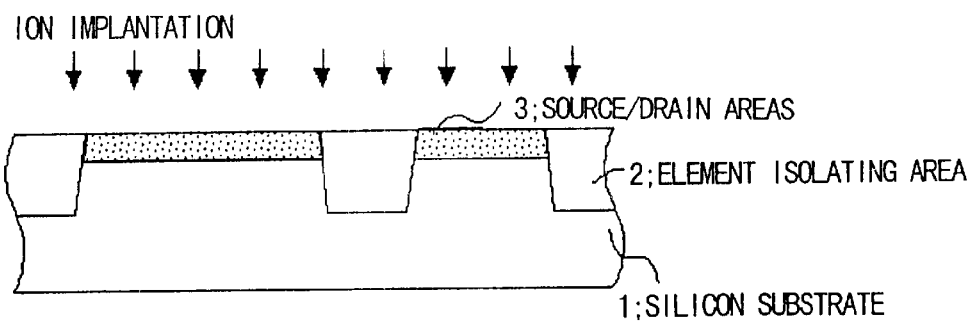
FIGS. 1A–1D are sectional views schematically explaining the steps of a process for manufacturing the semiconductor device of the first embodiment of the present invention.
Figure 1:
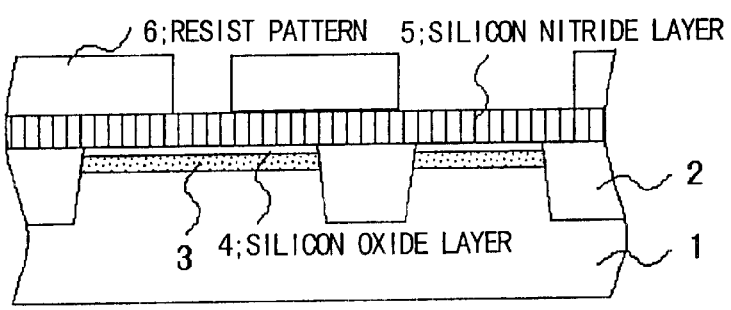
Figure 1:
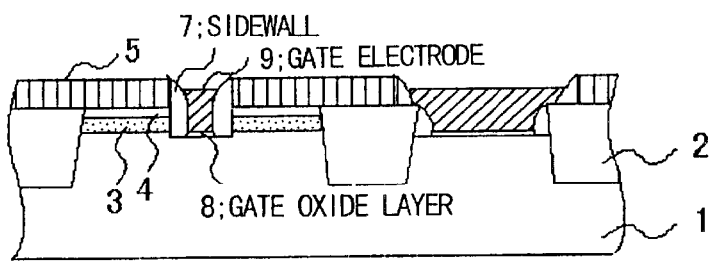
Figure 1:
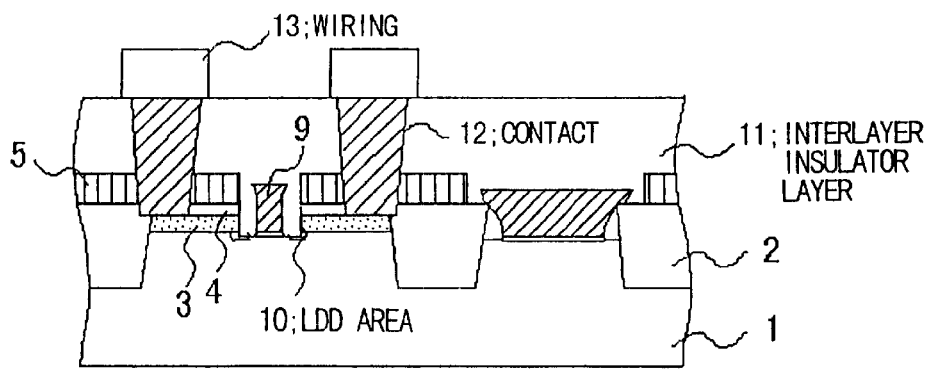

The semiconductor device of the present invention comprises a silicon substrate on which source/drain areas (3 in FIG. 1), a silicon oxide layer (4 in FIG. 1) and a silicon nitride layer (5 in FIG. 1) are successively formed in this order, and a trench which extends through the layers to split the source/drain area in a preferred embodiment. A columnar gate electrode (9 in FIG. 1) is formed within the trench in such a manner that it is spaced from the inner wall of the trench and a lightly doped drain (LDD) area (10 in FIG. 1) is formed at an area of the bottom of the trench in which no gate electrode is disposed. In such a structure, the short channel effect which occurs in association with reduction in the gate length is suppressed.

EMBODIMENTS

The embodiments of the present invention will be described in more detail with reference to the drawings.

Embodiment 1

Now, a process for manufacturing the semiconductor device of a first embodiment of the present invention will be described with reference to FIG. 1. FIGS. 1(A) to 1(D) are sectional views schematically explaining the process for manufacturing the semiconductor device of the first embodiment of the present invention.

As shown in FIG. 1(A), an element isolating area 2 is formed on a silicon substrate 1 using, for example, a trench isolating and forming process and then source/drain areas 3 which will become diffusion layer areas are formed by implanting ions of arsenic or phosphorus or boron or boron fluoride into N or P channel area, respectively, at a dose rate of 1E15 cm$^{-2}$ through 1E16 cm$^{-2}$ by an ion implanting process.

Subsequently, as shown in FIG. 1(B), a silicon oxide film 4 having a thickness of 5 nm through 30 nm is formed by thermal oxidation and a silicon nitride layer 5 having a thickness of 50 nm to 200 nm is formed by the chemical vapor deposition (CVD) process or the like. Then, a resist pattern 6 for forming a gate electrode 9b is formed. Thereafter, a trench is formed by anisotropically conducting dry-etching of the silicon nitride layer 5, the silicon oxide layer 4 and the silicon substrate 1 successively by using the resist pattern 6 as a mask. The etching rate of the silicon substrate 1 is adjusted in such a manner that it is more deeply etched than the source/drain areas 3.

Then, as shown in FIG. 1(C), a sidewall 7 having a thickness of 30 nm through 100 nm is formed within the trench by using, for example, a silicon oxide layer. After the silicon oxide layer 8 having a thickness of 2 nm through 5 nm has been formed by the thermal oxidation process, polysilicon is deposited to a thickness of 10 nm through 50 nm by, for example, CVD process and is etched back for forming a gate electrode 9. The etching back can be carried out by, for example, CMP process, using as an etching stopper the silicon nitride layer 5 which has been formed on the surface of the substrate.

Then, the sidewall 7 is removed by etching as shown in FIG. 1 (D). An LDD area 10 is then formed by implanting ions of arsenic or phosphorus, or boron or boron fluoride into N or P channel area, respectively, at a dose rate of 5E12 cm$^{-2}$ through 5E14 cm$^{-2}$ by an ion implanting process.

Then, an interlayer insulator layer 11 is formed and the resist pattern for forming contacts 12 is formed. Thereafter, the interlayer insulator layer 11 and the silicon nitride layer 5 are successively etched by using the resist pattern as a mask. This etching is conducted under such a condition that a selection ratio between the silicon oxide layer 5 and the interlayer insulator layer 11 can be adjusted. The etching of the silicon nitride layer 5 is conducted under such a condition that the selection ratio between the silicon substrate 1 and the element isolating area 2 can be adjusted. Thereafter, the inside of the contact 12 is filled with, for example, tungsten, and then wiring 13 is formed.

As mentioned above, in the present embodiment, the gate length can be control led by the sidewall 7 when the gate electrode 9 is formed as shown in FIG. 1(C). For example, a semiconductor device having a gate length of 0.1 μm can be formed by making the width of the sidewall 0.05 μm in case where the resist pattern 6 for forming the gate electrode 9 has a length of 0.2 μm. The channel area of the transistor can be formed at a position deeper than the source/drain areas 3 by digging silicon substrate 1 deeper than the source/drain areas 3 when the trench is formed prior to the formation of the gate electrode 9. The short channel effect of the transistor can be thus suppressed.

Since the etching of the interlayer insulator layer 11 is conducted under such a condition that a selection ratio (i.e., ratio between selective etching rates for each of layers) between the silicon oxide layer 5 and the interlayer insulator layer 11 can be adjusted. And the etching of the silicon nitride layer 5 is conducted under such a condition that the selection ratio between the silicon substrate 1 and the element isolating area 2 can be adjusted as shown in FIG. 1(D). The element isolation area 2 is not removed upon etching of contact hole 12 even if the contact hole 12 is formed (opened) above the element isolating area 2. Accordingly, a leak current between the contact 12 and a silicon substrate 1 can be suppressed.

Embodiment 2

Figure 2:
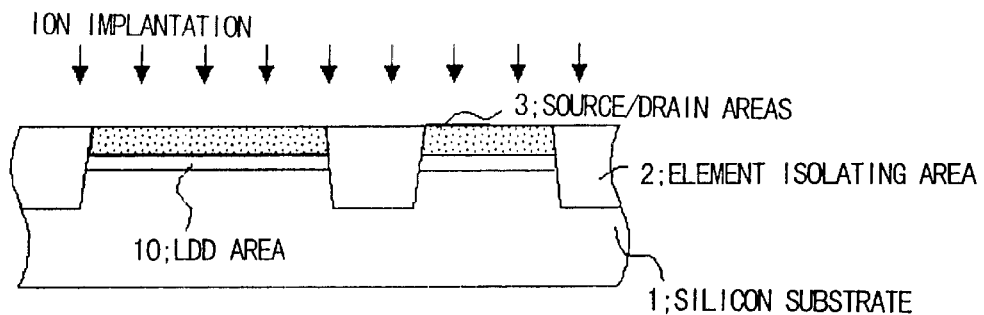
FIGS. 2A–2D are sectional views schematically explaining the steps of a process for manufacturing the semiconductor device of the second embodiment of the present invention.
Figure 2:
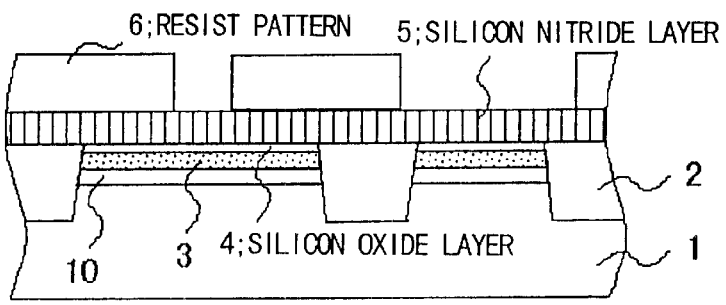
Figure 2:
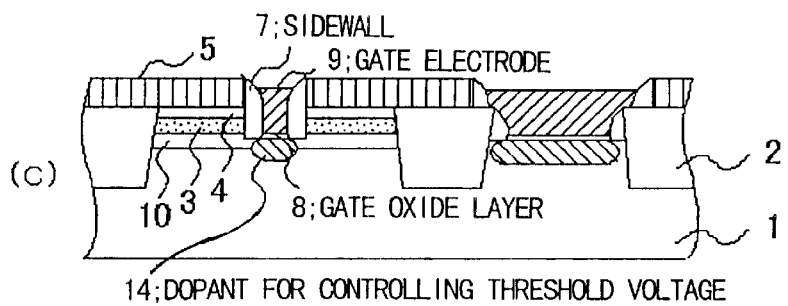
Figure 2:
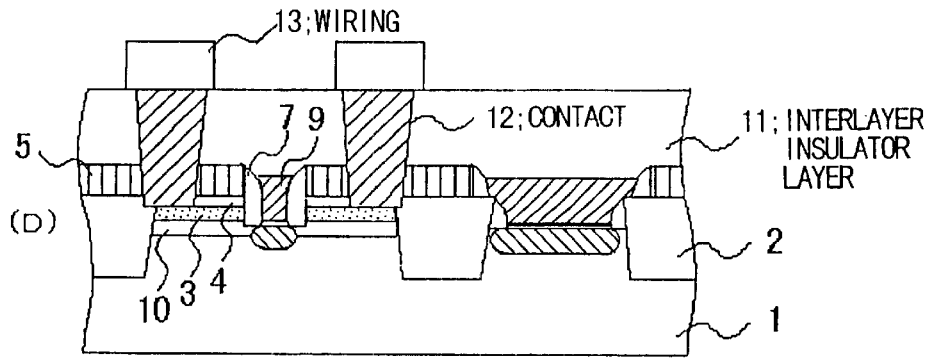

Now, a process for manufacturing the semiconductor device of a second embodiment of the present invention will be described with reference to FIG. 2. FIGS. 2(A) to 2(D) are sectional views schematically explaining the process for manufacturing the semiconductor device of the second embodiment of the present invention.

As shown in FIG. 2(A), an element isolating area 2 is formed on a silicon substrate 1 by using, for example, a trench isolating and forming process and then an LDD area 10 is then formed by implanting ions of arsenic or phosphorus, or boron or boron fluoride into N or P channel areas, respectively, at a dose rate of 5E12 cm$^{-2}$ through 5E14 cm$^{-2}$ by an ion implanting process. Thereafter the source/drain areas 3 which will become diffusion layer areas are formed by implanting ions of arsenic or phosphorus or boron or boron fluoride into N or P channel areas, respectively, at a dose rate of 1E15 cm$^{-2}$ through 1E16 cm$^{-2}$ by an ion implanting process.

Subsequently, as shown in FIG. 2(B), a silicon oxide film 4 having a thickness of 5 nm through 30 nm is formed by thermal oxidation and a silicon nitride layer 5 having a thickness of 50 nm to 200 nm is formed by the chemical vapor deposition (CVD) process. Then, a resist pattern 6 for forming a gate electrode 9b is formed. Thereafter, a trench is formed by anisotropically conducting dry-etching of the silicon nitride layer 5, the silicon oxide layer 4 and the silicon substrate 1 successively by using the resist pattern 6 as a mask. The etching rate of the silicon substrate 1 is adjusted in such a manner that it is shallowerly etched than the LDD area 10 and deeper than the source/drain areas 3.

Then, as shown in FIG. 2(C), a sidewall 7 having a thickness of 30 nm through 100 nm is formed within the trench by using for example the silicon oxide layer. The threshold voltage is control led by implanting a dopant such as boron, boron fluoride, arsenic, or phosphorus by using the ion implanting process. After the silicon oxide layer 8 having a thickness of 2 nm through 5 nm has been formed by thermal oxidation, polysilicon is deposited to a thickness of 10 nm through 50 nm by, for example, CVD process and is etched back for forming a gate electrode 9. The etching back can be achieved by, for example, CMP process, using, as an etching stopper, the silicon nitride layer 5 which has been formed on the surface of the substrate.

Then, an interlayer insulator layer 11 is formed and the resist pattern for forming contacts 12 is formed as shown in FIG. 2(D). Thereafter, the interlayer insulator layer 11 and the silicon nitride layer 5 are successively etched by using the resist pattern as a mask. This etching is conducted under such a condition that a selection ratio between the silicon oxide layer 5 and the interlayer insulator layer 11 can be adjusted. The etching of the silicon nitride layer 5 is conducted under such a condition that the selection ratio between the silicon substrate 1 and the element isolating area 2 can be adjusted. Thereafter, the inside of the contact 12 is filled with, for example, tungsten and then wiring 13 is formed.

Since the LDD area 10 is formed at the step of forming the source/drain areas 3 in the second embodiment of the present invention as mentioned above, it is not necessary to conduct the step of removing the sidewall 7. It is possible to reduce the manufacturing cost in comparison with that of the above-mentioned first embodiment.

The meritorious effects of the present invention are summarized as follows.

As mentioned above, the gate length can be made shorter than the limitation of the lithography since control of the gate length is conducted by the sidewall as mentioned above in accordance with the present invention. Since the channels are formed by digging the substrate, the channels of the transistor can be formed at a position lower than the source/drain areas which are the diffusion layers, the present invention provides an advantage in that the short channel effect can be suppressed.

Since the contact is formed by using the silicon nitride layer as a stopper, etching of the element isolating area due to the etching of the contact can be suppressed even if the contact hole is opened above the element isolating area, the leaked current between the contact and the silicon substrate can be suppressed.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A process for manufacturing a semiconductor device comprising:
   (a) forming element isolating areas on a semiconductor substrate;
   (b) forming a source and drain layer of a transistor by an ion implanting process;
   (c) successively laminating a silicon dioxide layer and a silicon nitride layer in this order;
   (d) forming a trench having such a depth that it reaches said semiconductor substrate by etching said silicon nitride layer, said silicon oxide layer and said source and drain layer by using a resist pattern as a mask;
   (e) forming a sidewall on an inner wall of said trench;
   (f) filling a space surrounded by said sidewall of said trench with a first electrically conductive material designed to become a columnar gate electrode;
   (g) removing said sidewall;
   (h) forming a lightly doped drain layer by implanting ions in an area of said trench below said columnar gate electrode in which said sidewall has been removed;
   (i) forming an interlayer insulator layer over an entirety of said semiconductor substrate;
   (j) forming a contact hole by etching through said interlayer insulator layer, said silicon nitride layer and said silicon oxide layer; and
   (k) forming a predetermined wiring after embedding the inside of said contact hole with a second electrically conductive material, wherein a channel area of said transistor is formed at a position deeper than a source and drain area of said source and drain layer.

2. A process for manufacturing a semiconductor device as defined in claim 1, wherein said step (j) comprises:

conducting the etching of said interlayer insulator layer under such a condition that the etching rate of said silicon nitride layer is lowered; and conducting the etching of said silicon nitride layer under such a condition that the etching rate of said silicon oxide layer and said semiconductor substrate is lowered.

3. A process for manufacturing a semiconductor device as defined in claim 1, wherein forming said columnar gate electrode within said trench is spaced from said inner wall of said trench with said lightly doped drain area formed at a bottom of said trench in which no said columnar gate electrode is disposed.

4. A process for manufacturing a semiconductor device as defined in claim 1, wherein said channel area of said transistor is formed at a position deeper than said source and drain layer, and said columnar gate electrode within said trench is spaced from said inner wall of said trench with said lightly doped drain area formed at a bottom of said trench in which no said columnar gate electrode is disposed.

5. A process for manufacturing a semiconductor device comprising:

forming element isolating areas on a semiconductor substrate;

forming a source and drain layer of a transistor by an ion implanting process;

successively laminating a silicon dioxide layer and a silicon nitride layer in this order;

forming a trench having such a depth that it reaches said semiconductor substrate by etching said silicon nitride layer, said silicon oxide layer and said source anddrain layer by using a resist pattern as a mask;

forming a sidewall on an inner wall of said trench;

forming a doped area which splits the lightly doped drain layer below said trench by implanting a dopant by using said sidewall as a mask;

forming a lightly doped drain layer by implanting ions in an area below said columnar gate electrode in which said sidewall has been removed;

forming an interlayer insulator layer over an entirety of said semiconductor substrate;

forming a contact hole by etching through said interlayer insulator layer, said silicon nitride layer and said silicon oxide layer; and forming a predetermined wiring after embedding the inside of said contact hole with a second electrically conductive material.

6. A semiconductor device as defined in claim 5 in which said doped area is formed by implanting any of dopants selected from the group consisting of boron, boron fluoride, arsenic and phosphorous.

7. A process for manufacturing a semiconductor device as defined in claim 5, wherein said step (j) comprises:

conducting the etching of said interlayer insulator layer under such a condition that the etching rate of said silicon nitride layer is lowered; and conducting the etching of said silicon nitride layer under such a condition that the etching rate of said silicon oxide layer and said semiconductor substrate is lowered.

8. A process for manufacturing a semiconductor device comprising:

(a) forming a trench which splits a source and drain layer of a transistor formed on a semiconductor substrate by an ion implanting process and has such a depth that it reaches said semiconductor substrate;

(b) forming a sidewall within said trench; and (c) forming a columnar gate electrode which is disposed within said trench at a position which is spaced from said sidewall of said trench, by filling a space surrounded by said sidewall with a gate material.

9. A process for manufacturing a semiconductor device comprising:

(a) forming a trench which splits a source and drain layer of a transistor formed on a semiconductor substrate having a lightly doped drain (LDD) layer and said source and drain layer successively formed theron in this order and has such a depth that it reaches said lightly doped drain layer;

(b) forming a columnar gate electrode which is disposed within said trench at a position spaced from a sidewall of said trench, by filling a space surrounded by said sidewall with a gate material; and (c) forming a doped area beneath said trench, which splits said lightly doped drain layer and reaches said semiconductor substrate by implanting ions via said sidewall.

* * * * *